United States Patent [19]

Howell et al.

[11] Patent Number: 4,498,227

[45] Date of Patent: Feb. 12, 1985

[54] WAFER FABRICATION BY IMPLANTING THROUGH PROTECTIVE LAYER

[75] Inventors: Paul J. Howell, Gray; Gregory B. Currier, Yarmouth, both of Me.

[73] Assignee: Fairchild Camera & Instrument Corporation, Mountain View, Calif.

[21] Appl. No.: 510,761

[22] Filed: Jul. 5, 1983

[51] Int. Cl.$^3$ .................. H01L 21/265; H01L 21/318
[52] U.S. Cl. .................. 29/576 B; 29/576 E; 29/576 W; 29/578; 29/580; 148/1.5; 148/175; 148/187; 156/643; 156/653; 156/657; 156/659.1; 357/49; 357/50; 357/91; 357/34
[58] Field of Search ............ 29/576 B, 576 E, 576 W, 29/578, 580; 148/1.5, 175, 187; 156/643, 653, 657, 659.1, 661.1; 357/49, 50, 91, 34

[56] References Cited

U.S. PATENT DOCUMENTS

| | | | |
|---|---|---|---|
| 4,111,724 | 9/1978 | Ogive et al. | 148/175 |
| 4,199,380 | 4/1980 | Farrell et al. | 148/1.5 |
| 4,261,763 | 4/1981 | Kumar et al. | 148/1.5 |
| 4,408,387 | 10/1983 | Kiriseko | 29/576 E |
| 4,412,378 | 11/1983 | Shinada | 29/578 |
| 4,433,471 | 2/1984 | Ko et al. | 29/576 B X |
| 4,440,580 | 4/1984 | Gahle | 148/1.5 |

OTHER PUBLICATIONS

Okada et al., "New Polysilicon Process . . . PSA Technology" Trans. on Electron Devices (IEEE), vol. Ed-26, No. 4, Apr. 1979, pp. 385–389.

*Primary Examiner*—William G. Saba
*Attorney, Agent, or Firm*—Kenneth Olsen; Carl L. Silverman; Daniel H. Kane, Jr.

[57] ABSTRACT

Manufacture of bipolar substantially isoplanar integrated circuit structures is accomplished by rearrangement of the conventional masking steps and by the substitution and full integration of implanting methods for diffusion methods. A uniform nitride layer is deposited over the basic structure of epitaxial islands separated by isolation oxide regions thereby passivating and protecting the isolation oxide regions, epitaxial oxide buffer layer and epitaxial layer from environmental contaminants. The nitride layer which forms part of a composite protective layer is maintained in place throughout a major portion of the fully integrated sequential implanting steps during which the collector sink, base and emitter regions are introduced into the epitaxial islands. At least a portion of the composite protective layer is a barrier to environmental contaminants throughout the process. The overall number of steps is reduced, etching steps minimized, and overall reliability of the structure improved. The process also includes field implanting of phosphorus in the isolation oxide for continuous gettering of ionic contaminants.

20 Claims, 10 Drawing Figures

WAFER FABRICATION BY IMPLANTING THROUGH PROTECTIVE LAYER

TECHNICAL FIELD

This invention relates to an improved isoplanar process for fabricating integrated circuits with reduced number of process steps and improved reliability by implanting the integrated circuit elements through a protective layer.

BACKGROUND ART

The basic method for fabricating bipolar isoplanar integrated circuits with oxidized isolation is described by Douglas L. Peltzer in U.S. Pat. No. 3,648,125. A thin silicon epitaxial layer, formed on a silicon substrate is subdivided into electrically isolated islands or mesas by a grid of oxidized regions of epitaxial silicon material referred to as oxidized isolation regions or isolation oxide regions. The annular shaped isolation oxide regions defining and separating the epitaxial islands are oxidized through the epitaxial layer to the laterally extending PN junction between the epitaxial layer and substrate, referred to as the isolation junction. The top surfaces of the epitaxial islands and the isolation oxide regions are substantially coplanar.

In the conventional isoplanar process the active and passive integrated circuit elements are then formed in the epitaxial islands by a complex sequence of masking and diffusion steps for selectively introducing P-type and N-type dopant materials into different regions of the epitaxial islands defined by the sequence of masks. In the original isoplanar process all of the bipolar regions of P-type conductivity or N-type conductivity are introduced by diffusion. In a typical diffusion sequence, a uniform oxide layer is grown across the epitaxial layer although a layer of other mask material such as nitride layer may be used. A photoresist layer is spun on the oxide layer, the photoresist layer is exposed through a light mask to a pattern of light, and the exposed or unexposed portions of the photoresist are developed and washed away leaving a photoresist mask pattern. The sequence of steps involved in forming the photoresist mask are sometimes referred to as a dry mask step or dry mask sequence. A dry mask sequence results in an overlying photoresist mask pattern. The overlying photoresist mask pattern is then used as an etching mask for etching the exposed portions of the underlying layer. Typically the portions of the underlying layer exposed through the photoresist mask are selectively removed by a chemical etchant which does not effect the photoresist material. A plasma etch, however, may also be used. The photoresist material is then chemically removed leaving a mask of oxide, nitride or other mask material. The sequence of steps by which an underlying layer is etched through the photoresist mask to produce a mask for introducing dopant material is sometimes referred to as a wet mask step or wet mask sequence because of the typical use of chemical etchants.

A traditional isoplanar process is characterized by the following mask sequences:

1.0 Buried Collector Mask
2.0 Isolation Oxide Mask
3.0 Collector Sink Mask
4.0 Nitride or Self-Aligned Transistor Mask
5.0 Emitter Mask or N+ Mask
6.0 Base Mask or P+ Mask
7.0 Contact Mask
8.0 Etc. Metalization Masks Each of the foregoing mask steps in the sequence with the exception of Base Mask 6.0 involves both a dry mask sequence for forming a photoresist mask pattern, and a wet mask sequence for etching the underlying oxide layer to form an oxide mask. The etching, of course, may be accomplished by either a chemical etch or a plasma etch.

The typical diffusion sequence introduces selective regions of N-type or P-type conductivity material in the epitaxial islands. The alternating dry mask procedure and wet mask procedure result in the oxide mask, or other material mask, which then serves as a diffusion mask for diffusing a dopant material of the desired conductivity type through the openings in the mask layer. Upon completion of the diffusion step, the oxide mask must be stripped away and a new oxide layer grown. The further diffusion steps then follow, each involving both dry mask and wet mask sequences. A complete account of the diffusion steps of the traditional isoplanar process may be found, for example, in the Peltzer U.S. Pat. No. 3,648,125 referred to above.

While Peltzer made a basic contribution to the isoplanar fabrication process by the introduction of isolation oxide regions for isolating the epitaxial islands, a number of disadvantages are attendant upon the continued use of diffusion methods. First, the so called dry mask and wet mask sequences result in exposure of the epitaxial layer to environmental contaminants once the oxide layer has been etched. Furthermore, upon completion of a diffusion step, the oxide layer must be stripped away briefly exposing the entire epitaxial layer to environmental contaminants before the new oxide layer is grown. Second, diffusion affords only imprecise control over introduction of the dopant material because diffusion proceeds laterally away from the mask opening as well as axially into the epitaxial layer. Third, the diffusion sequence of dry masks and wet masks requires an inordinate number of steps which increase the time and expense of the manufacturing process.

As a result, modifications have been introduced by semiconductor manufacturers into the isoplanar process to reduce the number of steps and to increase reliability. For example, some of the diffusion steps have been replaced by implant steps in which the dopant material of the selected conductivity type is introduced into the epitaxial layer by a directed ion beam. The present isoplanar processes for forming active and passive elements in the epitaxial islands may therefore typically comprise a hybrid process of diffusion and implanting steps. Such hybrid isoplanar processes are exemplified by the Farrell et al, U.S. Pat. No. 4,199,380.

The isoplanar process has been modified at Fairchild Camera & Instrument Corporation of Mountain View, Calif., to substitute an emitter implant step for the emitter diffusion step. Thus, the 5.0 emitter mask involves a dry mask step only in which the photoresist mask pattern is formed and used for selectively implanting the emitter regions. An ion beam of, for example, N+ type dopant material is directed through the selective openings in the photoresist mask for introducing the dopant material into the emitter regions. Similarly, the base regions may be implanted so that the 6.0 base mask step involves a dry mask sequence only, forming a photoresist mask pattern for directing an ion beam, for example, of P+ type dopant material into the base regions.

The hybrid processes of which applicant is aware generally suffer the disadvantage that at one or more occasions through the fabrication process, the protective insulation layer, be it an oxide layer or a nitride layer must be etched or stripped away exposing the underlying epitaxial layer to environmental contaminants. Furthermore, none of the hybrid processes have achieved a full integration of the implant method for introducing dopant material into the fabrication process while retaining in place a passivating nitride layer as a barrier to environmental contaminants. For example, Wen C. Ko et al in U.S. patent application, Ser. No. 340,395, filed Jan. 18, 1982, now U.S. Pat. No. 4,433,471, entitled "Ion Implanted Memory Cells for High Density Ram", while fully converting to implant methods, do not retain a nitride layer for passivating the structure. While the partial introduction of implant methods increases reliability, there is further opportunity for substantial reduction in the number of process steps and therefore the fabrication time and expense while passivating the structure substantially throughout the process.

OBJECTS OF THE INVENTION

It is therefore an object of the present invention to provide a new and improved isoplanar process which fully integrates ion implant methods into the isoplanar process and fully substitutes the ion implant methods for diffusion methods.

Another object of the invention is to provide an improved isoplanar process in which a passivating protective layer is provided over the epitaxial layer throughout the fabrication process. According to this object of the invention there is no stripback of the protective insulating layer and no exposure of the epitaxial layer to environmental contaminants throughout the formation of active and passive elements in the epitaxial islands.

A further object of the invention is to substantially reduce the number of steps and sequences in the bipolar isoplanar process thereby reducing fabrication time and expense. The invention also seeks to increase reliability of devices by, for example, dramatically reducing the parasitic MOS transistor effect caused by contaminant ions in the isolation oxide.

DISCLOSURE OF THE INVENTION

The process of manufacturing a bipolar substantially isoplanar integrated circuit structure begins with a substrated of semiconductor material of first conductivity type. The substrate is typically processed by introducing at least one buried region of dopant material of a second conductivity type in the substrate to function as a buried collector. However, there need not necessarily be in each instance a buried collector layer. An epitaxial layer of semiconductor material is deposited over the substrate and buried region. An isolation PN junction therefore extends laterally through the structure between the epitaxial layer and substrate. A thin epitaxial oxide buffer layer is formed over the epitaxial layer. The fabrication normally continues by subdividing the structure into a plurality of epitaxial islands in which active and passive elements are to be formed, and isolating the epitaxial islands relative to each other by forming annular shaped isolation oxide regions of oxidized semiconductor material extending through the epitaxial layer to the isolation junction.

The objects of the present invention are achieved by depositing a uniform nitride layer or layer of other insulating material over the basic structure, thereby passivating the structure and protecting the isolation oxide regions, epitaxial oxide buffer layer and epitaxial layer from environmental contaminants. A feature and advantage of the invention is that the uniform layer of nitride or other insulating material in combination with the epitaxial oxide buffer layer forms a composite protective layer over the structure. According to the invention the composite protective layer is maintained in place throughout a major portion of the steps during which the collector sink, base and emitter regions are introduced into the epitaxial islands. Furthermore, at least a portion of the composite protective layer is a barrier to environmental contaminants throughout the process of introducing collector sink, base and emitter regions into the epitaxial islands. The surface of the epitaxial silicon layer thus remains protected and unexposed until it is finally necessary to deposit the metalization contacts at the surface locations of the respective collector sink, base and emitter regions.

The invention contemplates that the entire sequence of fabricating active and passive elements in the epitaxial islands by introducing selective N-type and P-type regions be accomplished through a passivating protective layer and that such layer be maintained in place throughout the introduction of selectively doped regions until the respective surface locations of the collector sink, base and emitter regions are exposed for the deposit of metalization contacts. This is accomplished according to the present invention by a rearrangement of the conventional masking steps and by the substitution and full integration of implanting methods for diffusion methods. The present invention therefore provides a fully integrated sequential implanting process directed through a continuously maintained passivating protective layer. A feature and advantage of this aspect of the invention is that the wet mask or etching steps are minimized and the overall number of steps required for the isoplanar process are reduced. Another feature of the invention is that the integrated circuit structure is passivated and protected from environmental contaminants throughout the fabrication of active and passive elements in the epitaxial islands until the metalization contacts are deposited.

In order to accomplish these results, the present invention provides the steps of forming a sink implant mask of resist material in a pattern over the nitride layer for defining collector sink regions in the epitaxial islands and implanting through the sink implant mask openings by directing a beam of ions of a second conductivity type through the composite protective layer comprising the nitride layer and epitaxial oxide buffer layer. The energy of the beam is adjusted to implant the collector sink regions in the epitaxial layer. After removing the sink implant mask while retaining the nitride layer and epitaxial oxide buffer layer in place, the invention contemplates forming a base implant mask of resist material in a pattern over the nitride layer for defining base regions in the epitaxial islands and implanting through the base implant mask openings by directing a beam of ions of first conductivity type through the composite protective layer. The beam energy is adjusted for implanting base regions in the epitaxial layer. This aspect of the present invention provides a further modification and simplification of the isoplanar process by implanting the base before implanting the emitter regions.

The process proceeds by removing the base implant mask, retaining the nitride layer and epitaxial oxide buffer in place as a barrier to environmental contaminants, and forming a self-aligned transistor mask pattern over the nitride layer for defining the surface locations of the collector sink, base and emitter regions in alignment relative to each other. At this point in the improved isoplanar process the invention retains a wet mask or etching step by etching the underlying nitride layer through the openings in the self-aligned transistor mask pattern removing the nitride layer at the surface locations of the collector sink, base and emitter regions. Importantly, however, the epitaxial oxide buffer layer, being a portion of the composite passivating protective layer is retained in place as a barrier to environmental contaminants. After removing the photoresist self-aligned transistor mask pattern, the invention therefore contemplates retaining the epitaxial oxide buffer layer in place at the surface locations where the nitride layer was removed by etching. Thus, throughout the fabrication of active and passive elements at least a portion of the composite passivating and protective layer is retained in place. According to another aspect of the invention the unetched remainder of the nitride layer is retained in place to function as a nitride self-aligned transistor mask as hereafter described.

Further steps in the improved process comprise forming an emitter implant mask pattern of resist material over the nitride layer and exposed portions of epitaxial oxide buffer layer for defining the emitter regions in the epitaxial islands and implanting through the emitter implant mask openings by directing a beam of ions of second conductivity type through the epitaxial oxide buffer layer. The energy of the ion beam is adjusted for implanting the emitter regions in base regions previously implanted in the epitaxial islands. The successive implanting steps through successive implant masks is followed by the single reduced annealing step of simultaneously annealing the implanted collector sink, base and emitter regions thereby providing the substantially isoplanar integrated circuit structure of active and passive elements which coincide with the epitaxial islands separated by isolation oxide regions.

The invention contemplates a number of additional features and variations. According to further steps the improved process contemplates removing the emitter implant mask while retaining the unetched portions of the nitride layer in place for use of the nitride layer as a nitride layer self-aligned transistor mask. An etching step follows by etching the epitaxial oxide buffer layer at the surface locations of the collector sink, base and emitter regions through the nitride layer self-aligned transistor mask exposing the epitaxial layer at the collector sink, base and emitter surface locations for deposit of metalized contacts through the nitride layer self-aligned transistor mask. A feature and advantage of the present invention is that the exposure of the epitaxial layer at the collector sink, base and emitter surface locations may be accomplished by a blanket etching of the portions of the epitaxial oxide layer exposed through the nitride layer self-aligned transistor mask pattern. A contact mask step is therefore entirely eliminated.

Further efficiency is achieved by using the current practice of providing an emitter implant mask pattern formed with openings defining the collector sink regions in addition to the emitter regions. The step of implanting through the emitter implant mask openings therefore comprises directing a beam of ions of second conductivity type for implanting emitter regions while at the same time overdoping the surface locations of the collector sink regions to reduce surface contact resistance. In another improvement according to the invention, the sink implant mask pattern is formed with openings defining the isolation oxide regions in addition to the collector sink surface locations. The step of implanting through the sink implant mask openings therefore comprises directing a beam of ions of second conductivity type for implanting collector sink regions and for field implanting ions of phosphorous into the isolation oxide regions for continuous gettering and for passivating the isolation oxide regions.

The present invention affords a number of advantages and improvements over the conventional fabrication process. For example, the present invention increases the reliability of the integrated circuit structures. The phosphorus ions field implanted in the isolation oxide getter and passivate contaminant ions in the oxide such as, for example, sodium and potassium ions which typically occur in the oxide as a result of normal manufacturing processes. Even minute amounts of contaminant sodium and potassium ions will migrate in an electric field in the oxide to the bottom of the oxide when a positive charge is applied to an overlying metal contact of the device. The migrating contaminant ions carry positive charges eliciting N-type carriers in the underlying silicon substrate. As a result, the underlying P-type material may become effectively N-type forming a parasitic MOS FET transistor with the overlying metal contact. The parasitic MOS transistor effect produced by contaminant ions in the isolation oxide is responsible for a substantial percentage of the defective devices in any batch produced according to conventional fabrication processes. According to the present invention, the field implant phosphorus ions getter the contaminant ions, passivate the isolation oxide regions, prevent the threshold voltage of the parasitic MOS transistors from being achieved or exceeded by motion of contaminant ions, and substantially eliminate parasitic MOS transistor field inversion effects caused by contaminant ions. The percentage of defective devices is therefore dramatically reduced and the percentage of defective devices atrributable to contaminant ion parasitic MOS transistor effect is substantially eliminated.

According to another feature of the invention, in the growth of isolation oxide regions, the temperature and other parameters are selected to minimize fracturing of epitaxial islands by the expanding oxide of the isolation oxide regions.

It is apparent that the overall objectives of the present invention are achieved by full integration of implanting techniques in the introduction of active and passive elements into the epitaxial islands, reordering and reduction of masking steps in combination with the implanting methods to simplify the fabrication process, and by maintaining in place at least a portion of a composite passivating protective layer over the entire structure throughout fabrication and introduction of the active and passive elements into the epitaxial islands.

Other objects, features and advantages of the present invention are apparent in the following specification and accompanying drawings.

DESCRIPTION OF PREFERRED EXAMPLE EMBODIMENTS AND BEST MODE OF THE INVENTION

Figure 1:
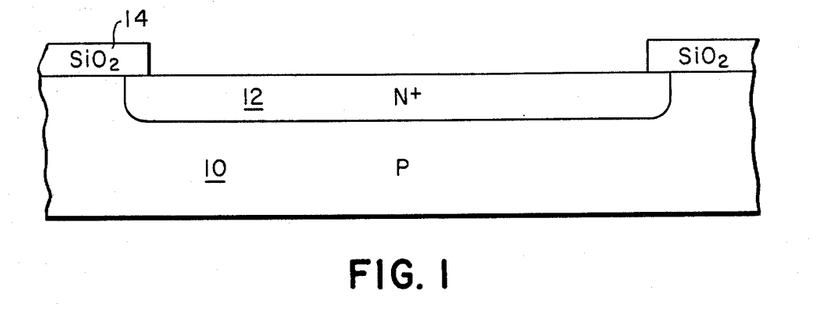
FIG. 1 is a fragmentary view in diagrammatic cross section of a portion of an integrated circuit structure at a location where an epitaxial island is to be formed and showing a buried collector layer introduced in the substrate.

FIG. 1 shows in diagrammatic cross section a fragmentary portion of a substrate 10 of, for example, P-type silicon in which N-type impurity or dopant material has been introduced to form the buried collector region 12. The thickness of the substrate 10 is not shown to scale and would of course be many times greater. The buried collector region is introduced by the following convention method. First, a silicon oxide layer 14 is grown uniformly across the entire substrate. A dry mask procedure follows in which a photoresist material is spun on the oxide layer to form a uniform photoresist layer. The photoresist is exposed through a light mask with openings defining the buried regions. The exposed portions of the photoresist layer are washed away with the developer leaving the photoresist material as an etching mask.

The so-called "dry mask" sequence is followed by a wet mask sequence in which the underlying oxide layer 14 is etched to expose the substrate 10 at the surface locations where impurities are introduced to form the buried collector layers 12. The photoresist mask pattern is then removed leaving the oxide layer 14 in the pattern shown in FIG. 1 to serve as a diffusion mask. Typically a chemical etchant is used to etch the oxide layer, however, a dry plasma etch may also be used. Upon completion of the so-called "wet mask" sequence, N-type conductivity material is diffused through the openings in diffusion mask 14 to form the buried collector layers 12 as shown in FIG. 1. The buried collector region 12 is doped to a very high level indicated by the notation $N^{30}$ to increase conductivity of the silicon in the vicinity of the buried collector region. The buried layer 12 serves to collect electrons ejected by the emitter region to the collector sink region hereafter described. While a buried collector region is typical, other collector structures may also be used.

Figure 2:
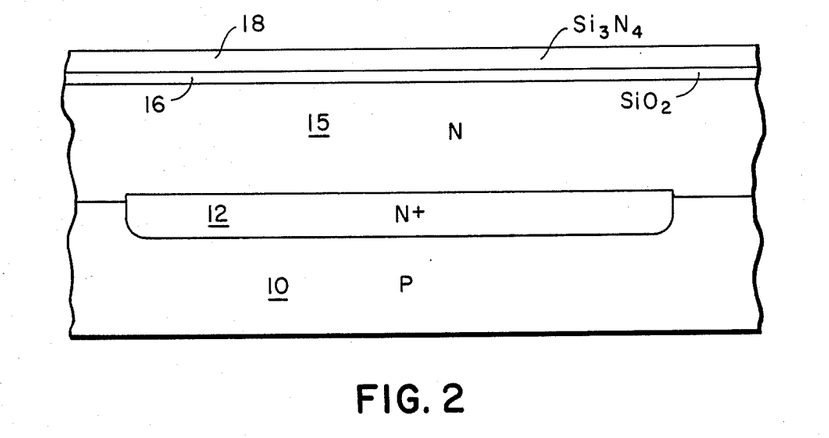
FIG. 2 is a diagrammatic cross section of the same portion of the integrated circuit structure showing formation of the epitaxial layer, epitaxial oxide layer and nitride layer.

The oxide layer 14 is then stripped off the substrate and epitaxial layer 15 shown in FIG. 2 is formed over the substrate. The epitaxial layer 15 is comprised of N-type silicon precipitated on to the substrate in the form of a single crystal layer by an epitaxial chemical vapor deposition type process. While the epitaxial layer and substrate are typically of opposite conductivity type, they may also be of the same conductivity type material. The surface of epitaxial layer 15 is oxidized to form a thin epitaxial oxide layer 16 of silicon dioxide ($SiO_2$). Epitaxial oxide layer 16 comprises an isoplanar oxide layer which provides stress relief for the next layer, nitride layer 18. Epitaxial layer 15 must remain a monocrystalline layer which, however, may be stressed and broken by the nitride layer 18. The "epi-ox" layer 16 therefore provides the buffer for stress relief. Nitride layer 18 is deposited over the epitaxial oxide buffer layer 16 by chemical vapor deposition from an external source. The silicon nitride layer is of the chemical form $Si_xN_yO_z$ ideally comprising $Si_3N_4$. The silicon nitride layer is generally referred to herein as the nitride layer 18.

Figure 3:
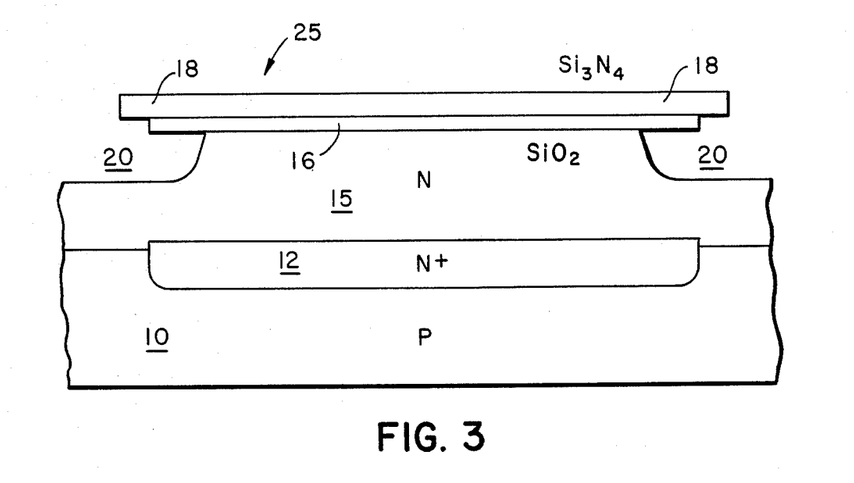
FIG. 3 is a diagrammatic cross section at the same location showing formation of the epitaxial island, mesa, or pedestal.

In order to establish the epitaxial islands a nitride masking procedures follows including both dry mask and wet mask sequences. First, the photoresist layer is spun on the nitride layer and exposed through a light mask defining the surface locations of the isolation oxide regions. The exposed or unexposed portions of the photoresist layer are washed away according to whether a positive of negative photoresist material is used, leaving the photoresist mask to function as an etching mask. The dry mask sequence is followed by a wet mask sequence involving three etching steps which may be wet chemical etches or dry plasma etches. In the first etch step the nitride layer 18 is etched through the photoresist mask using a silicon nitride selective etchant and the photoresist mask may then be removed. The underlying epitaxial oxide layer 16 is then etched with an oxide etch using the nitride layer 18 as an etching mask. Finally, the epitaxial layer 15 of N-type silicon is etched in a silicon etching step at locations 20 on either side of the buried layer 12 to form the epitaxial island, mesa or pedestal 25 having a hat or cover formed by the unetched portions of silicon nitride layer 18 and silicon dioxide layer 16. The silicon etch is carried out to a depth of approximately one-half of the epitaxial layer 15.

According to one variation of the present invention, the silicon etching step is carried to a depth slightly greater than the conventional depth and oxide is grown in the isolation oxide spaces 20 at a temperature slightly higher than the conventional temperature of 1000° C., for example, in the range of 1050° C. to 1100° C. As a result of the oxidation of the silicon at a slightly higher temperature range, the fracturing effect of the isolation oxide on the epitaxial island 25 is minimized or eliminated.

Before growth of the isolation oxide, P-type impurities or dopant material is diffused into the very top surfaces of the substrate 10 and epitaxial layer 15 underlying the isolation oxide spaces 20. The introduction of P-type conductivity material into the surface locations 10a and 15a respectively of the substrate 10 and epitaxial layer 15 underlying the isolation oxide regions in combination with the gettering of ion contaminants in the isolation oxide by field implant of phosphorus ions as hereafter described, assures the reliability of the integrated circuit structure by substantially eliminating the problem of parasitic MOS (FET) transistor effects between adjacent epitaxial islands. The P-type implant or diffusion, comprised, for example, of boron introduced into the surface areas 10a and 15a provides a channel stop between adjacent mesas or islands. The P-type diffusion of boron may be carried out to a P or P+ level and may be introduced alternatively by implanting with an ion beam or diffusion.

Figure 4:
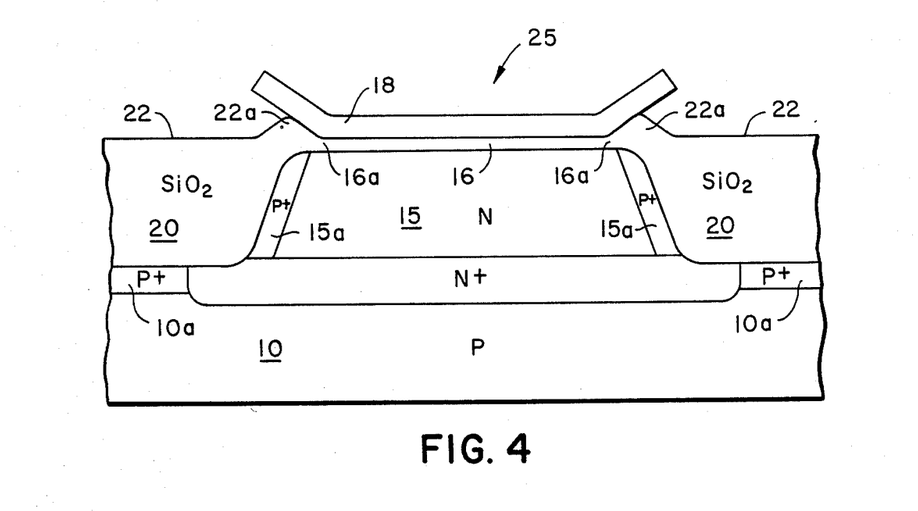
FIG. 4 is a diagrammatic cross section of the epitaxial island showing formation of the isolation oxide regions.

After preparation of the surface channel stops, the isolation oxide 22 is grown in the isolation oxide regions or spaces 20 isolating the epitaxial islands 25 from each other by annular shaped isolation oxide regions. During oxidation and growth of the isolation oxide, the epitaxial layer 15 in the vicinity of the isolation oxide regions is entirely consumed so that the isolation oxide portions extend through the epitaxial layer to the isolation junction between epitaxial layer 15 and substrate 10. The silicon oxide grown from silicon in the isolation oxide regions generally occupies twice the volume of the original silicon so that the isolation oxide 22 in the region 20 and the epitaxial islands 25 are substantially isoplanar. During growth of the isolation oxide, the characteristic birds' heads 22a and birds' beaks 16a form on either side of the epitaxial island 25.

Figure 5:
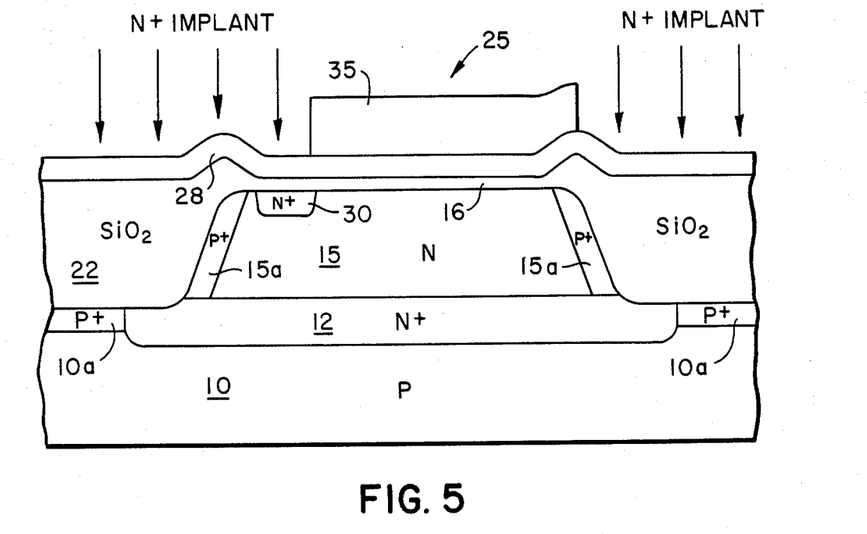
FIG. 5 is diagrammatic cross section of the epitaxial island showing implanting of the collector sink region with simultaneous field implanting of the isolation oxide regions.

The remaining portions of the original nitride layer 18 are then stripped off the surface of the integrated circuit structure and a new silicon nitride layer 28 is grown uniformly over the structure as shown in FIG. 5. According to conventional procedures, instead of regrowing the silicon nitride layer 28, a thick oxide layer would be formed over the structure followed by dry mask and wet mask sequences for introducing the collector sink region hereafter described. Instead, according to the present invention, the new uniform nitride layer 28 is formed over the entire structure which in combination with epitaxial oxide layer 16 forms a composite passivating protective layer across the entire integrated circuit structure. According to the present invention, there is no need to grow another oxide layer and further steps of etching and growing oxide are eliminated. As hereafter described according to the present invention, implanting techniques are fully integrated into the isoplanar process for fabricating the active and passive elements in the epitaxial islands 25. Nitride provides a sound protective layer for all the elements below including the epitaxial oxide layer 16, isolation oxide 22 and epitaxial silicon 15. The nitride layer 28 prevents accumulation of environmental contaminants and ions in the structure, passivating the wafer. To this end the new nitride layer 28 is formed immediately as shown in FIG. 5 after completion of oxidation and growth of the isolation oxide 22 as shown in FIG. 4. On the other hand in the conventional process there may be a long period of up to six steps during which portions of the epitaxial layer and other underlying elements are exposed to environmental contaminants. The improved isoplanar process according to the present invention passivates the wafer including the epitaxial layer, epitaxial oxide layer and isolation oxide immediately.

The collector sink region 30 is then implanted through the passivating silicon nitride layer 28 and epitaxial layer 16 with the layers 28 and 16 retained in place. This is accomplished by ion implantation directing an ion beam of N-type conductivity, impurity or dopant material, for example, phosphorus, through the respective layers. The ion beam is generated according to conventional procedures and equipment stripping an electron from the phosphorus atom, applying an accelerating field, and focusing the phosphorus ion beam with plates or magnets. The mass spectrometer effect of the equipment filters out the phosphorus ion beam for implanting at the selective locations in the integrated circuit structure. The ion beam is generated at energy high enough to pass through the nitride layer 28 and epitaxial oxide layer 16 to implant the N-type epitaxial layer 15 with pure phosphorus in the collector sink region 30 to provide an N+ or N++ implant.

Selective implantation is accomplished by use of a dry mask sequence only. A photoresist layer 35 is spun on the nitride layer 28 and exposed through a light mask pattern which according to the present invention defines through openings, not only the collector sink regions 30, but also the isolation oxide regions 20 and isolation oxide 22. The photoresist layer 35 is developed by washing away the exposed or unexposed portion of photoresist according to whether a positive or negative photoresist material is used, leaving a photoresist mask 35 which functions as an implant mask not only for implanting the collector sink regions 30 but also for field implanting phosphorus ions in the isolation oxide regions. A typical ion beam energy for implanting a phosphorus ion beam of N-type carriers to achieve an N+ concentration of carriers in the collector sink region while at the same time field implanting phosphorus ions for continuous gettering of the isolation oxide is, for example, 180 kev. Such a beam energy achieves implant of the collector sink region in the epitaxial layer 15 through the passivating nitride layer 28 and the epitaxial oxide layer 16. The collector sink implant and field implant for passivating the isolation oxide may therefore be accomplished simultaneously according to the method of the present invention. The collector sink implant and field implant may, of course, be carried out sequentially. Where the N-type carrier is phosphorus, however, the invention contemplates simultaneous implant. The phosphorus ion beam is scanned over the surface locations of the isolation oxide regions in addition to the collector sink regions. This may be done simultaneously, according to the present invention, because the passivating phosphorus ion implants will not be etched away in a subsequent oxide etch, as all such etching steps have been eliminated as hereafter more fully appears. Any contaminants which enter the oxide regions are therefore chemically contained by the gettering ions without any modification in the device performance. Thus, the device performance remains intact and furthermore throughout the step of the sink implant and concurrent field implant, the passivating nitride layer 28 remains in place as a barrier to environmental contaminants.

Figure 6:
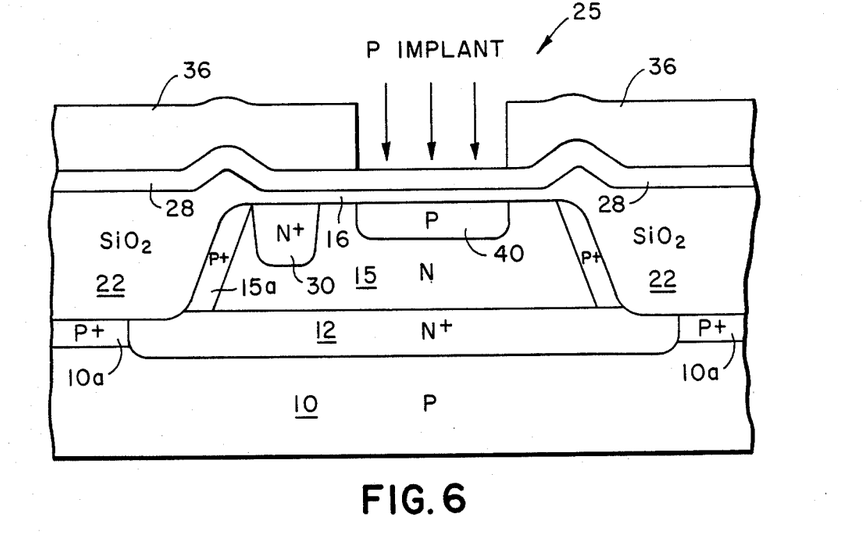
FIG. 6 is a diagrammatic cross section of the epitaxial island showing implant of the base region.

The silicon nitride layer 28 and epitaxial oxide layer 16 are retained while the sink implant photoresist mask 35 is removed. A new photoresist layer is then spun on the nitride layer 28, exposed through a light mask, and the exposed or unexposed portions are washed away by developer according to whether a positive or negative photoresist material is used, leaving the photoresist mask pattern 36 for implanting the base regions as illustrated in FIG. 6. The photoresist mask pattern 36 thus serves as an implant mask for implanting the base region 40 by directing an ion beam of impurities of P-type conductivity such as a boron ion beam through openings in the photoresist mask with sufficient energy to penetrate the nitride layer 28 and epitaxial oxide layer 16 thereby introducing the P-type base region 40 into the epitaxial layer 15 of epitaxial island 25.

Figure 6A:
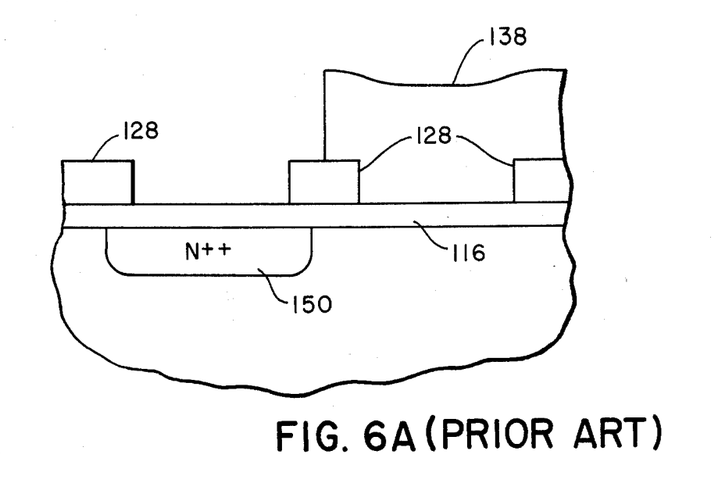
FIGS. 6A and 6B are diagrammatic fragmentary cross sections showing the prior art process for introducing the emitter and base regions.
Figure 6B:
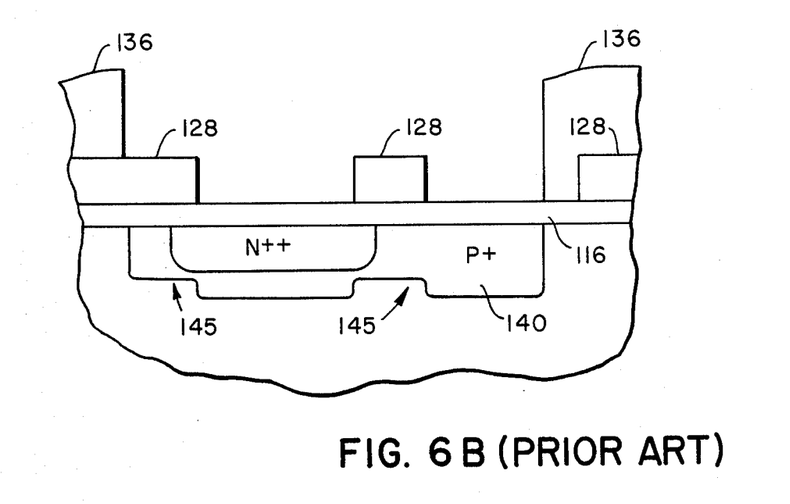

Contrary to the conventional isoplanar process, base region 40 is implanted before the emitter region is introduced into the epitaxial island. This affords a number of advantages. First, implanting the base region permits retaining the protective layer in place. Second, implanting the base 40 as shown in FIG. 6 affords a base region of uniform thickness and flat profile. Third, because of the greater control over introduction of impurities afforded by implanting techniques, there is little lateral diffusion and the base region 40 and sink region 30 remain separated and non-contiguous. The boron ion beam implant may be carried out with an energy of, for example, 80 Kev. Furthermore, by implanting the base before the emitter an adequate base width or clearance can be maintained between the lower limit of the emitter region and the lower limit of the base region as hereafter illustrated with reference to FIG. 7. This is to be contrasted with the standard process shown in FIG. 6A according to which the emitter 150 is first introduced through the epitaxial oxide layer 116 and openings in the photoresist mask layer 138 and nitride layer 128 before the base is introduced. As shown in FIG. 6B, the base 140 is thereafter introduced through openings in the photoresist mask layer 136 and nitride layer 128. Due to the lower total implant stopping power at the openings in the nitride layer 128, the base profile runs deeper below the openings than in the adjacent regions. The uneven depth and profile of the base 140 combined with lateral diffusion of the emitter 150 produces a narrow width or separation between the lower limit of the emitter region 150 and the lower limit of the base region 140 at points 145. This narrow separation produces high field regions on the edges of the emitters and consequent "leaky" transistors. Not only does the method of the present invention eliminate the problem of uneven base width and profile, but also implanting of the base region is accomplished by retaining the composite protective layer in place consisting of both the passivating nitride layer 28 and epitaxial oxide layer 16.

Figure 7:
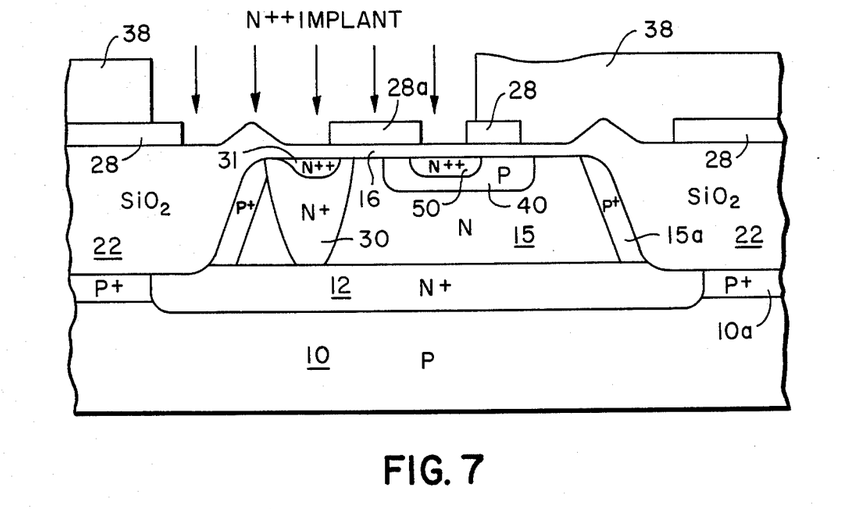
FIG. 7 is a diagrammatic cross section of the epitaxial island showing implant of the emitter region with simultaneous overdoping of the collector sink surface location for minimizing surface contact resistance.

The photoresist base implant mask 36 is then removed while retaining the nitride layer 28 in place. A new photoresist layer is spun on the nitride layer and the photoresist layer is then exposed to a self-aligned transistor mask pattern. The exposed or unexposed portions of the photoresist layer are developed and washed away according to whether a positive or negative photoresist material is used, leaving a self-aligned transistor (SAT) mask pattern for etching the underlying nitride layer. Such a self-aligned transistor mask pattern is described in the Farrell et al U.S. Pat. No. 4,199,380 and the Ko et al Patent Application, Ser. No. 340,395 referred to above. After formation of the photoresist SAT etching mask pattern, the nitride layer 28 is etched for the first time in the improved isoplanar process according to the invention. Thus, all steps are completed that can be completed with the nitride layer 28 in place before the nitride etch step. The etching of nitride layer 28 through the photoresist SAT mask pattern results in the nitride layer pattern 28 illustrated in FIG. 7. Importantly, only the nitride layer 28 is etched and not the underlying epitaxial oxide layer 16. Epitaxial oxide layer 16 is exposed through the openings etched in the nitride layer 28 at the surface locations of the collector sink base and emitter regions as shown in FIG. 7. Viewing the nitride layer 28 and epitaxial oxide layer 16 as a composite protective layer, therefore only a portion of the composite is etched and removed as may be required for the emitter implant step while retaining the epitaxial oxide layer 16 in place as a protective barrier for the epitaxial islands.

After completion of the nitride etch the photoresist SAT mask pattern is removed and a new photoresist layer is spun on the etched nitride layer 28 in preparation for the emitter implant sequence. The new photoresist layer is exposed through a light mask pattern and the exposed or unexposed portions of photoresist are developed and washed away leaving a photoresist emitter region implant mask pattern 38 as illustrated in FIG. 7. According to the present practice, openings formed in the photoresist mask pattern 38 permit not only implanting selective impurities in the emitter regions 50, but also overdoping a surface portion 31 of the collector sink region 30 to reduce surface contact resistance at the collector sink region.

The emitter implant step is designed to implant, for example, N-type conductivity impurities to a greater concentration of carriers designated by the symbol $N^{++}$ in FIG. 7. The higher concentration and higher conductivity implant is accomplished by directing an ion beam of N-type conductivity ion impurities such as arsenic ions through the epitaxial oxide layer 16 and into the epitaxial layer thereby implanting the emitter region 50 and the overdoped collector sink surface location 31, all as shown in FIG. 7. Typically, the ion beam energy for implanting arsenic ions in the emitter region and surface location of the collector sink region is in the order of 100 kev. The progressive migration or diffusion of the collector sink region 30 as illustrated sequentially in FIGS. 5, 6 and 7 until the collector sink region 30 contacts the buried collector 12 follows as a result of various heating steps, etc. during the isoplanar fabrication process as is well known in the art. The portion 28a of nitride layer 28 serves as a barrier to the N-type conductivity ion beam to maintain separation of the collector sink region 30 and base region 40. Implanting the emitter regions and overdoping the surface locations of the collector sink regions through the epitaxial oxide layer 16 according to the present invention saves additional etching and masking steps required in the conventional isoplanar process.

The photoresist emitter implant mask pattern 38 is then removed and all the implants for the collector sink, base and emitter regions are then simultaneously annealed in a single step also driving the implants for the collector sink region 30 and emitter region 50 to the appropriate desired depths are illustrated in FIG. 7. The present invention thus consolidates the separate annealing steps of the conventional process into a single step upon completion of all implants. Prior annealing steps are eliminated thereby simplifying the improved process.

Figure 8:
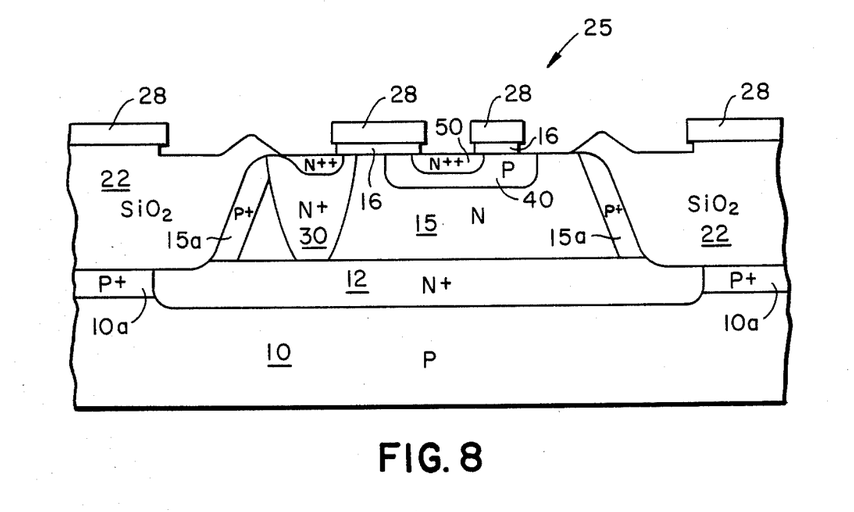
FIG. 8 is a diagrammatic cross section of the epitaxial island showing after etching in preparation for deposition of metalization contacts at the surface locations of the collector sink, base and emitter regions.

The final step of the improved isoplanar process modifications, according to the present invention, is a blanket etching away of the portions of epitaxial oxide layer 16 exposed through the openings etched in nitride layer 28 as shown in FIG. 8. No further masking steps are required for selectively etching away and removing the portions of epitaxial oxide layer 16 overlying the surface locations of the collector sink, base and emitter regions. Whereas prior art methods would require a further contact masking step to protect the diffused areas while etching away the oxide to prevent undercutting, the present invention merely requires a blanket etching step through the openings in nitride layer 28 which functions effectively as a nitride layer SAT mask for etching and removing the exposed portions of epitaxial oxide layer 16. Metalization contacts may be deposited directly on the surface locations of the collector sink, base and emitter regions without further masking using the etched nitride layer 28 as the effective mask for selective deposition of metalization contacts.

A summary of the improved bipolar isoplanar process steps according to the present invention is as follows:
 1.0 Buried Collector Mask
 2.0 Isolation Oxide Mask
 3.0 Collector Sink Mask (Dry Mask Sequence Only)
 6.0 Base Mask or P+ Mask (Dry Mask Sequence Only)
 4.0 Nitride or Self-Aligned Transistor (SAT) Mask
 5.0 Emitter Mask or N+ Mask (Dry Mask Sequence Only)

The improved isoplanar process of the invention therefore eliminates the 7.0 Contact Mask steps, the 3.0 Collector Sink Mask wet mask or etching sequence and 5.0 Emitter Mask wet mask or etching sequence. The passivating nitride layer is retained in place until all steps which can be completed with the nitride layer in place are in fact completed. The steps are rearranged to permit optimization of the process with the nitride layer in place and the nitride layer is then etched through the SAT mask sequence only before implanting of the emitter region. Nevertheless, the epitaxial oxide layer, part of the composite protective layer is retained in place even for the emitter implant step. Overall, the number of wet etching sequences in comparison with conventional isoplanar processes is reduced from 6 to 2, dry mask sequences reduced from 5 to 4, implant steps increased from 2 to 3, while the annealing steps are consolidated thereby reducing the number of thermal heating steps.

While the invention has been described with reference to particular example embodiments of bipolar devices with particular sequences of N-type and P-type conductivity semiconductor materials and regions, the polarity may be reversed with N-type conductivity materials substituted for P-type conductivity materials and vice-versa in accordance with the invention while still preserving all features and advantages. Furthermore, the invention is intended to cover all modifications and equivalents within the scope of the following claims.

We claim:
1. A method for fabricating a bipolar substantially isoplanar integrated circuit structure on a substrate of semiconductor material of a first conductivity type, said substrate being processed by depositing an epitaxial layer of semiconductor material over the substrate thereby forming an isolation junction extending laterally through the structure between the epitaxial layer and substrate, forming a thin epitaxial oxide buffer layer over the epitaxial layer, subdividing said structure into a plurality of epitaxial islands in which active and passive elements are fabricated, and isolating said epitaxial islands relative to each other by forming annular shaped isolation oxide regions of oxidized semiconductor material extending through the epitaxial layer to the isolation junction, wherein the improvement in the method of fabricating said structure comprises:
 depositing a uniform nitride layer over the structure thereby passivating the structure and protecting the isolation oxide regions, epitaxial oxide buffer layer and epitaxial layer from contaminants;
 implanting collector sink regions in the epitaxial islands by selectively directing a beam of ions of second conductivity type through the nitride layer and epitaxial oxide buffer layer into the epitaxial layer at collector sink region surface locations;
 retaining the nitride layer and epitaxial oxide buffer layer in place as a barrier to environmental contaminants;
 implanting base regions in the epitaxial islands by selectively directing a beam of ions of first conductivity type through the nitride layer and epitaxial oxide buffer layer into the epitaxial layer at base region surface locations before implanting emitter regions;
 retaining the nitride layer and epitaxial oxide buffer layer in place as a barrier to environmental contaminants;
 forming a self-aligned transistor mask pattern over the nitride layer for defining the surface locations of collector sink, base and emitter regions in self-alignment relative to each other on the epitaxial islands through openings in the self-aligned transistor mask pattern;
 etching the underlying nitride layer through the openings in the self-aligned transistor mask pattern and removing the nitride layer at the surface locations of the collector sink, base and emitter regions while retaining the epitaxial oxide buffer layer in place as a barrier to environmental contaminants;
 removing the self-aligned transistor mask pattern, retaining the unetched remainder of the nitride layer in place, and retaining the epitaxial oxide buffer layer in place at the surface locations where the nitride layer was removed by etching;
 implanting emitter regions in base regions previously implanted in the epitaxial islands by selectively directing a beam of ions of second conductivity type through the epitaxial oxide buffer layer into the epitaxial layer;
 simultaneously annealing the implanted collector sink, base and emitter regions thereby providing a substantially isoplanar integrated circuit structure of active and passive elements in the epitaxial islands separated by said isolation oxide regions.

2. The method of claim 1 further comprising the step of:
 etching the epitaxial oxide buffer layer at the surface locations of the collector sink, base and emitter regions defined by the openings in the nitride layer using the nitride layer as a self-aligned transistor mask thereby exposing the epitaxial layer at the collector sink, base and emitter surface locations on the epitaxial islands of the integrated circuit structure.

3. The method of claim 2 further comprising the step of depositing metalized contacts at the etched and exposed surface locations of the collector sink, base and emitter regions through the nitride layer self-aligned transistor mask thereby eliminating a contact masking step.

4. The method of claim 1 comprising the step of directing a beam of ions of second conductivity type into the collector sink regions a second time while implanting emitter regions thereby overdoping the surface locations of the collector sink regions to reduce surface contact resistance.

5. The method of claim 1 comprising the step of fluid implanting by selectively directing a beam of phosphorus ions into the isolation oxide regions for continuous gettering and for passivating the isolation oxide regions.

6. The method of claim 1 comprising the preliminary step of forming the isolation oxide regions in the preferred temperature range of 1050° C. to 1100° C. thereby substantially reducing the viscosity of the oxidized semiconductor material and eliminating the fracturing of epitaxial islands.

7. The method of claim 1 comprising the step of field implanting gettering ions of phosphorus in the isolation oxide regions.

8. A method for fabricating elements in a bipolar substantially isoplanar integrated circuit structure comprising a substrate of semiconductor material of a first conductivity type, at least one buried region of dopant material of a second conductivity type introduced in the substrate, an epitaxial layer of semiconductor material deposited over the substrate and buried region thereby forming an isolation junction extending laterally through the structure between the epitaxial layer and substrate, a thin epitaxial oxide buffer layer formed over the epitaxial layer, said structure being subdivided into a plurality of epitaxial islands in which the elements are fabricated, said epitaxial islands being isolated relative to each other by annular shaped isolation oxide regions of oxidized semiconductor material extending through the epitaxial layer to the isolation junction and wherein the improvement in the method of fabricating the elements comprises:

depositing a uniform nitride layer over the structure thereby passivating the structure and protecting the isolation oxide regions, epitaxial oxide buffer layer and epitaxial layer from contaminants;

forming a sink implant mask of resist material in a pattern over the nitride layer for defining collector sink regions in the epitaxial islands through openings formed in the sink implant mask;

implanting through said sink implant mask openings by directing a beam of ions of second conductivity type through the nitride layer and epitaxial oxide buffer layer into the epitaxial layer for implanting collector sink regions in the epitaxial islands;

removing the sink implant mask and retaining the nitride layer and epitaxial oxide buffer layer in place as a barrier to environmental contaminants;

forming a base implant mask of resist material in a pattern over the nitride layer for defining base regions in the epitaxial islands through openings formed in the base implant mask;

implanting through said base implant mask openings by directing a beam of ions of first conductivity type through the nitride layer and epitaxial oxide buffer layer into the epitaxial layer for implanting base regions before implanting the emitter regions;

removing the base implant mask and retaining the nitride layer and epitaxial oxide buffer layer in place as a barrier to environmental contaminants;

forming a self-aligned transistor mask pattern over the nitride layer for defining the surface locations of the collector sink, base and emitter regions in alignment relative to each other through openings in the self-aligned transistor mask pattern;

etching the underlying nitride layer through the openings in the self-aligned transistor mask pattern and removing the nitride layer at the surface locations of the collector sink, base and emitter regions while retaining the epitaxial oxide buffer layer in place as a barrier to environmental contaminants;

removing the self-aligned transistor mask pattern retaining the unetched remainder of the nitride layer in place, and retaining the epitaxial oxide buffer layer in place at the surface locations where the nitride layer was removed by etching;

forming an emitter implant mask pattern of resist material over the nitride layer and exposed portions of epitaxial oxide buffer layer for defining the emitter regions in the epitaxial islands through openings in the emitter implant mask;

implanting through said emitter implant mask openings by directing a beam of ions of second conductivity type through the epitaxial oxide buffer layer and into the epitaxial layer for implanting emitter regions in base regions previously implanted in the epitaxial islands;

simultaneously annealing the implanted collector sink, base and emitter regions thereby providing a substantially isoplanar integrated circuit structure of active elements coinciding with epitaxial islands separated by said isolation oxide regions.

9. The method of claim 8 further comprising the steps of:

removing the emitter implant mask while retaining the unetched portions of the nitride layer in place for use of the nitride layer as a nitride layer self-aligned transistor mask;

etching the epitaxial oxide buffer layer at the surface locations of the collector sink, base and emitter regions defined by the openings in the nitride layer self-aligned transistor mask thereby eliminating a further masking step and exposing the epitaxial layer at the collector sink, base and emitter surface locations on the epitaxial islands of the integrated circuit structure.

10. The method of claim 9 wherein said etching step comprises a blanket etching of oxidized semiconductor material through the nitride layer self-aligned transistor mask.

11. The method of claim 9 further comprising the step of depositing metalized contacts at the etched and exposed surface locations of the collector sink, base and emitter regions through the nitride layer self-aligned transistor mask thereby eliminating a contact mask step.

12. The method of claim 8 wherein the emitter implant mask pattern is also formed with openings defining the collector sink regions and wherein the step of implanting through said emitter implant mask openings comprises directing a beam of ions of second conductivity type for implanting emitter regions and for overdoping the surface locations of the collector sink regions to reduce surface contact resistance.

13. The method of claim 8 wherein the sink implant mask is also formed with openings defining the isolation oxide regions and wherein the step of implanting through said sink implant mask openings comprises directing a beam of ions of second conductivity type for implanting collector sink regions and for field implanting ions of phosphorus into the isolation oxide regions for continuous gettering and for passivating the isolation oxide regions.

14. The method of claim 8 wherein the integrated circuit structure is formed with dopant material of the first conductivity type introduced at the surface of the epitaxial layer and substrate portions which underlie the isolation oxide regions.

15. A method for fabricating a bipolar substantially isoplanar integrated circuit structure comprising a substrate of first conductivity type semiconductor material, an epitaxial layer semiconductor material on the substrate forming an isolation junction extending laterally through the structure between the epitaxial layer and substrate, said structure divided into a plurality of epitaxial islands by annular shaped isolation oxide regions of oxidized semiconductor material extending through the epitaxial layer to the isolation junction, at least some of said isolation islands comprising a collector sink region, a base region, and an emitter region, said collector sink, base and emitter regions having surface locations at the surface of the epitaxial layer, wherein the improvement in the method of fabrication comprises:

- forming a passivating composite protective layer across the epitaxial layer including the epitaxial islands and isolation oxide regions prior to fabricating the collector sink, base and emitter regions in the epitaxial islands;
- forming a sink implant mask pattern over the composite protective layer and implanting the sink regions according to the sink implant mask pattern by directing a beam of ions of a second conductivity type through the composite protective layer into the epitaxial layer;
- removing the sink implant mask pattern while retaining the composite protective layer in place and forming a base implant mask pattern over the composite protective layer;
- forming a base implant mask pattern over the composite protective layer and implanting the base regions according to the base implant mask pattern by directing a beam of ions of first conductivity type through the composite protective layer into the epitaxial layer thereby implanting the base regions before the emitter regions;
- removing the base implant mask pattern while retaining the composite protective layer in place and forming a self-aligned transistor mask pattern over the composite protective layer;
- etching part way through the underlying composite protective layer through the self-aligned transistor mask pattern for removing one component portion of the composite protective layer at the surface locations of the collector sink, base and emitter regions for aligning the surface locations of the collector sink, base and emitter regions while retaining a component portion of the composite protective layer as a barrier to contaminants;
- removing the self-aligned transistor mask pattern and forming an emitter implant mask pattern over the partially etched composite protective layer;
- implanting the emitter regions according to the emitter implant mask pattern by directing a beam of ions of the second conductivity type through the retained component portion of the composite protective layer and into the base regions of the epitaxial layer;
- whereby at least some of said isolation islands are transformed into active elements having implanted collector sink, base and emitter regions with aligned surface locations and whereby the collector sink, base and emitter regions are formed by implanting through a composite protective layer which passivates the structure and protects the epitaxial layer and isolation oxide regions from contamination throughout the fabrication process.

16. The method of claim 15 further comprising the step of simultaneously annealing the implanted collector sink, base and emitter regions.

17. The method of claim 15 further comprising the step of blanket etching and removing the remaining component portion of the protective layer etched through the self-aligned transistor mask at the surface locations of the collector sink, base and emitter regions in preparation for depositing metalized contacts at said aligned surface locations.

18. The method of claim 15 wherein the sink implant mask pattern comprises openings defining the surface locations of the sink regions and the isolation oxide regions and further comprising the step of field implanting gettering ions through the retained component portion of the composite protective layer into the isolation oxide regions for continuous gettering of the oxidized semiconductor material in the isolation oxide regions at the same time as implanting the sink regions.

19. The method of claim 15 wherein said etching step comprises wet etching.

20. The method of claim 15 wherein said etching step comprises plasma etching.

* * * * *